United States Patent
Chou et al.

(10) Patent No.: US 6,867,117 B2
(45) Date of Patent: Mar. 15, 2005

(54) ORGANIC DEVICE INCLUDING SEMICONDUCTING LAYER ALIGNED ACCORDING TO MICROGROOVES OF PHOTORESIST LAYER

(75) Inventors: Wei-Yang Chou, Tainan (TW); Horng-Long Cheng, Hsinchu (TW); Chih-Ming Lai, Hsinchu (TW); Chi-Chang Liao, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/864,775

(22) Filed: Jun. 9, 2004

(65) Prior Publication Data

US 2004/0222415 A1 Nov. 11, 2004

Related U.S. Application Data

(62) Division of application No. 10/613,200, filed on Jul. 3, 2003.

(30) Foreign Application Priority Data

Mar. 11, 2003 (TW) ........................................ 92105172 A

(51) Int. Cl.$^7$ ............................................... H01L 21/28
(52) U.S. Cl. ........................... 438/570; 257/40; 438/29; 438/69; 438/149; 438/150; 438/168; 428/1.1
(58) Field of Search .............................. 257/40; 438/29, 438/69, 149, 150, 168; 428/1.1

(56) References Cited

U.S. PATENT DOCUMENTS 6,723,394 B1 * 4/2004 Sirringhaus et al. ......... 428/1.1
6,737,303 B2 * 5/2004 Cheng et al. ................ 438/150

* cited by examiner

*Primary Examiner*—David Nelms
*Assistant Examiner*—Mai-Huong Tran
(74) *Attorney, Agent, or Firm*—Quintero Law Office

(57) ABSTRACT

An organic device including a substrate or a dielectric layer; a photoresist layer formed on the substrate or dielectric layer, wherein the photoresist layer is provided with a plurality of microgrooves having an alignment direction; an organic semiconducting layer having alignment formed on the photoresist layer, wherein the organic semiconducting layer aligns according to the alignment direction of the microgrooves of the photoresist layer; and an electrode.

22 Claims, 6 Drawing Sheets

ORGANIC DEVICE INCLUDING SEMICONDUCTING LAYER ALIGNED ACCORDING TO MICROGROOVES OF PHOTORESIST LAYER

This application is a divisional of U.S. application Ser. No. 10/613,200, filed Jul. 3, 2003.

BACKGROUND OF THE INVENTION

1. Field of the Invention

The present invention relates to a process for forming an organic semiconducting layer with molecular alignment, and more particularly to a process for forming an organic semiconducting layer with molecular alignment by means of forming microgrooves in a photoresist using photolithography.

2. Description of the Prior Art

In recent years, organic semiconducting material has drawn many researchers' attention and has proven to be one of the most popular candidates for fabrication of thin film transistors (TFTs) and various electronic and optoelectronic devices. Sirringhaus et al. of the University of Cambridge use self-organization to produce organic thin film transistor (OTFT) having different anisotropic alignment. It is found that the charge transport efficiency is increased with a better ordered molecular chain. For example, the carrier mobility can be increased by 100 times with a better ordered molecular chain. This proves that the molecular alignment of an organic molecule is a very important factor in enhancing the electrical properties of TFTs. (Nature, Vol. 401, p. 685, 1999).

The technology of controlling alignment of an organic molecule can be classified into the following three types.

(1) Self-organization: Sirringhaus et al. produce an organic integrated device including an organic thin film transistor (OTFT) and an organic light emitting diode (OLED). Functional groups in an organic molecule interact with the atom (such as silicon) in a substrate. The interaction provides the organic molecule with better alignment by self-organization. The molecular alignment of the organic molecules in the transistor is thus controlled (Nature, Vol. 401, p. 685, 1999).

(2) Rubbing or pulling: In U.S. Pat. No. 6,326,640, first, an orientation layer is formed by mechanical rubbing or electric or magnetic field pulling. Next, an organic layer is formed on the orientation layer. In this way, the organic molecule aligns according to the alignment of the orientation layer.

(3) Solvent annealing: In U.S. Pat. No. 6,312,971, an organic semiconducting film is first deposited on a substrate by printing or spin-coating. A specific solvent is selected, such that the alignment of the organic semiconducting molecule is altered using the vapor of the solvent. The electrical properties of OTFT are thus improved.

The above-mentioned conventional technology can only provide the organic semiconducting molecule with the same alignment over the entire substrate. Different alignments in different regions over the same substrate cannot be achieved.

SUMMARY OF THE INVENTION

An object of the present invention is to solve the above-mentioned problems and provide a process for controlling the molecular alignment of an organic semiconducting molecule. The present invention can form an organic semiconducting layer with different molecular alignments in different regions over the same substrate. Therefore, the alignment of an organic molecule in a transistor channel is accurately defined, thus, the device properties and circuit design are improved. Moreover, since the organic semiconducting layer has different alignments in different regions, it is possible to control the organic molecule to have better alignment in the OTFT channel region, thus providing better carrier transport efficiency during OTFT operation. Similarly, it is possible to control the organic molecule to have worse alignment in the non-channel region, thus decreasing the conductivity. In this way, current leakage and crosstalk between pixels can be decreased. Also, there is no need to directly pattern the organic material.

To achieve the above object, the process for forming an organic semiconducting layer having molecular alignment includes the following steps. First, a photoresist layer is formed on a substrate or a dielectric layer. Next, the photoresist layer is subjected to a photolithography process through a mask to form a plurality of microgrooves with an alignment direction. Finally, an organic semiconducting layer is formed on the photoresist layer having microgrooves, such that the organic semiconducting layer aligns according to the alignment direction of the microgrooves of the photoresist layer.

The present invention also provides an organic device, which includes a substrate or a dielectric layer; a photoresist layer formed on the substrate or dielectric layer, wherein the photoresist layer is provided with a plurality of microgrooves having an alignment direction; an organic semiconducting layer having alignment formed on the photoresist layer, wherein the organic semiconducting layer aligns according to the alignment direction of the microgrooves of the photoresist layer; and an electrode.

The present invention also provides a process for forming an organic device, which includes the following steps. First, a photoresist layer is formed on a substrate or a dielectric layer. Next, the photoresist layer is subjected to a photolithography process through a mask to form a plurality of microgrooves having an alignment direction. Next, an organic semiconducting layer is formed on the photoresist layer having microgrooves, such that the organic semiconducting layer aligns according to the alignment direction of the microgrooves of the photoresist layer. Finally, an electrode is formed.

DETAILED DESCRIPTION OF THE INVENTION

Figure 1A:
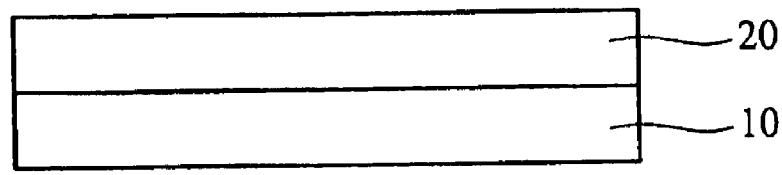
FIGS. 1a to 1c are cross-sections illustrating the process flow of forming the organic semiconducting layer with molecular alignment according to the present invention.
Figure 1B:
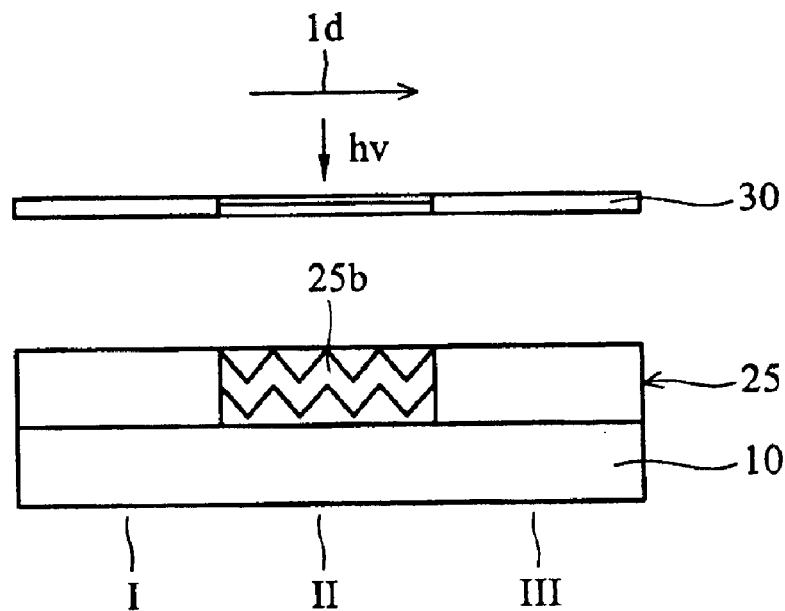
Figure 1C:
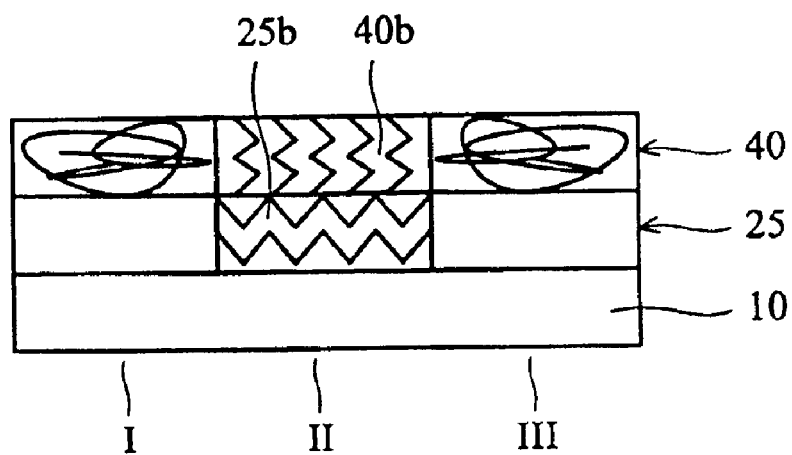

FIGS. 1a to 1c are cross-sections illustrating the process flow of forming the organic semiconducting layer with molecular alignment according to a preferred embodiment of the present invention.

Referring to FIG. 1a, a photoresist layer 20 is formed on a substrate or a dielectric layer 10. A suitable substrate can be a silicon wafer, glass, quartz, a plastic substrate, or a flexible substrate. Preferably, the dielectric layer can have a dielectric constants higher than 3 and be inorganic material or organic material. The organic material can be a polymer material. The photoresist layer can have a thickness of 0.5 $\mu$m to 5 $\mu$m.

Figure 2A:
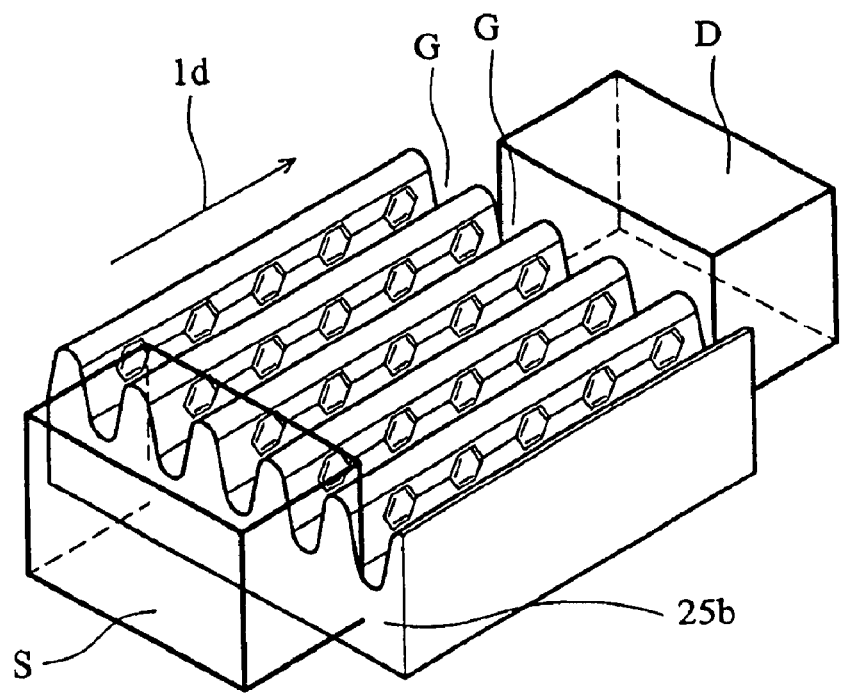
FIG. 2a is a perspective view showing the microgrooves of the photoresist layer of the present invention.
Figure 2B:
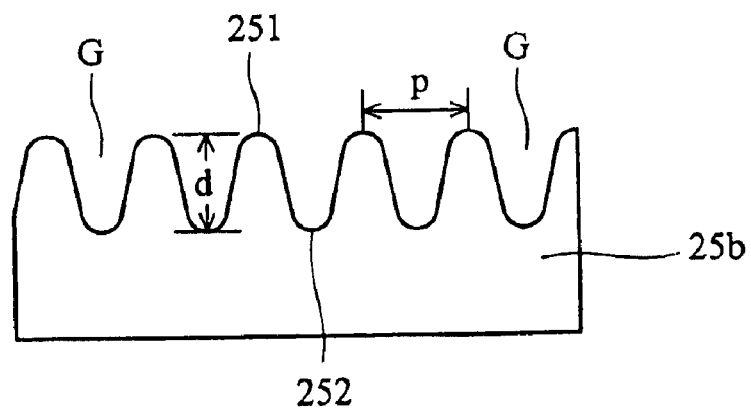
FIG. 2b is a cross-section showing the microgrooves of the photoresist layer of the present invention.

Subsequently, referring to FIG. 1b, the photoresist layer 20 is subjected to a photolithography process through a mask 30. The mask 30 completely masks regions I and III and partially masks region II. Thus, the photoresist layer 20 in regions I and III remains unchanged and the photoresist layer 20 in region II is partially removed, obtaining a photoresist layer 25. In the photoresist layer 25, the photoresist portion in region II is labeled as 25b. Suitable operational conditions (such as exposure energy) can be performed to provide the photoresist portion 25b with a plurality of microgrooves G (as shown in FIGS. 2a and 2b). These microgrooves G align according to the same direction 1d. Referring to FIG. 2b, the depth (d) of the microgrooves G is defined as the depth between a protruding portion 251 and a concave portion 252 and can be in the range of 0.3 $\mu$m and 1 $\mu$m. The width pitch (p) of the microgrooves is defined as the distance between two adjacent protruding portions 251 and can be in the range of 0.5 $\mu$m to 2 $\mu$m.

Subsequently, referring to FIG. 1c, an organic semiconducting layer 40 is formed on the photoresist layer 25 having microgrooves. The organic semiconducting layer 40 can be a small organic molecule or an organic polymer. The organic semiconducting layer can be formed by deposition, such as vacuum evaporation, vapor deposition, solution deposition, or directional deposition.

When the photoresist layer 25 is an organic material, the organic molecules in the organic semiconducting layer 40 easily react with the microgrooves G composed of an organic component. Therefore, in region II, the molecule chain in the organic semiconducting layer 40 will align to the alignment direction of the microgrooves G of the photoresist layer 25, thus forming an organic semiconducting portion 40b with the desired alignment. That is, in the present invention, the photoresist layer 25 having microgrooves G is used as an orientation film, and the overlying semiconducting layer 40 can align according to this orientation film. Since the organic semiconducting layer 40 of the present invention aligns according to the alignment direction of the microgrooves G, it is beneficial to charge transport, thus forming an effective transport channel. Moreover, the concave portion 252 of the microgroove G has a stronger electric field (e.g., discharge at the tip), which is also beneficial to charge transport. As to regions I and III, since the underlying photoresist layer 25 does not have microgrooves G, the organic semiconducting layer 40 in these two regions is random.

Figure 3:
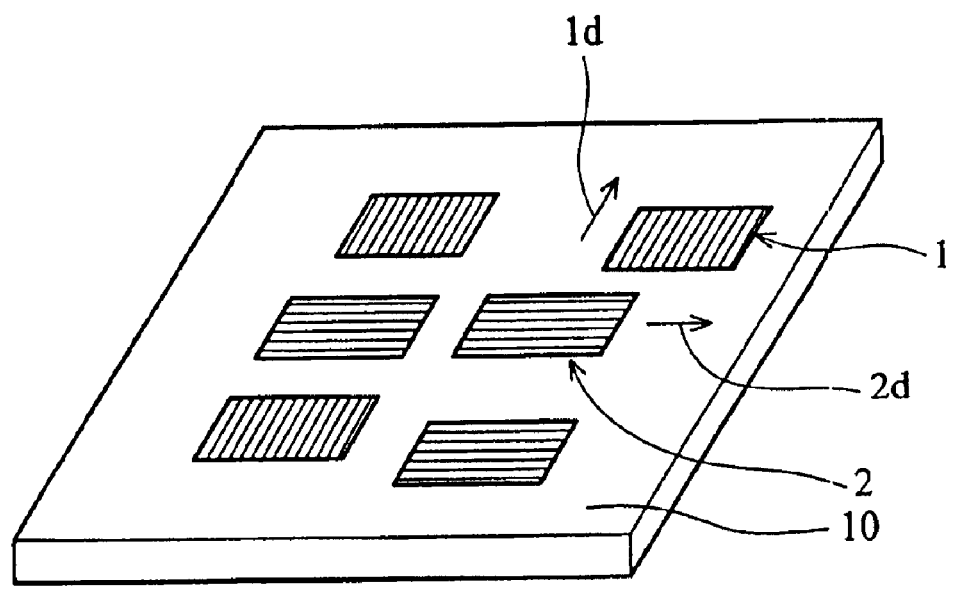
FIG. 3 shows the alignment condition of the microgrooves of the photoresist in different regions over the same substrate.

In addition, a plurality of microgrooves can be formed in different regions on the same substrate 10. For example, referring to FIG. 3, the microgrooves in region 1 of the substrate 10 have the same alignment direction 1d, and the microgrooves in region 2 have the same alignment direction 2d, but directions 1d and 2d are different. FIG. 2a is the magnification diagram of region 1 of the substrate 10 in FIG. 3.

Since the semiconducting layer 40 aligned according to the microgrooves G has a better channel transport property, the present invention can fabricate various organic devices based on this property. For example, referring to FIG. 2a, a source S and a drain D can be formed, such that the source S and the drain D are in contact with the organic semiconducting layer 40 with molecular alignment to form a channel between the source S and drain D. Thus, the organic semiconducting layer in the channel region aligns according to direction 1d, and the organic semiconducting layer in the non-channel region aligns according to a direction different from 1d or is random.

Figure 4A:
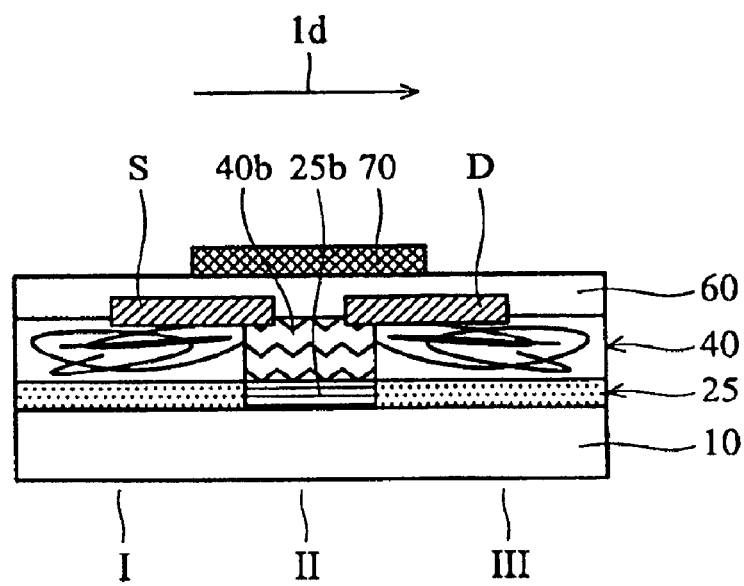
FIGS. 4a and 4b are cross-sections of the top-gate type OTFT of the present invention.

The above-mentioned structure, in which the organic semiconducting layer 40 aligned according to the microgrooves G and the channel between the source S and drain D has the same direction as the alignment direction 1d of the microgrooves G, can be applied in fabrication of various organic devices, such as top-gate organic thin film transistors. FIG. 4a shows the top-gate type organic thin film transistor (OTFT) according to the present invention. The top-gate OTFT includes a substrate 10; a photoresist layer 25 formed on the substrate 10, wherein the photoresist layer 25 is provided with a plurality of microgrooves having an alignment direction; an organic semiconducting layer 40 having alignment formed on the photoresist layer 25; and a source S and a drain D formed on the organic semiconducting layer 40; a dielectric layer 60 formed on the organic semiconducting layer 40, the source S, and drain D; and a gate 70 formed on the dielectric layer 60.

In FIG. 4a, the process of forming the photoresist layer 25 provided with a plurality of microgrooves G and the process of forming the organic semiconducting layer 40 are almost the same as mentioned above and are described in the following. Referring to FIG. 1a, a photoresist layer 20 having a thickness of 0.5 $\mu$m to 5 $\mu$m is formed on a substrate 10. Next, referring to FIG. 1b, the photoresist layer 20 is subjected to a photolithography treatment to form a photoresist layer 25. Region II of the photoresist layer 25 forms a plurality of microgrooves G that align according to the same direction 1d (as shown in FIG. 2a). The photoresist portion in region II is labeled as 25b. The photoresist layer in regions I and III remain unchanged.

Subsequently, referring to FIGS. 1c and 4a, an organic semiconducting layer 40 is formed on the photoresist layer 25 provided with microgrooves G. The organic semiconducting layer 40 can be a small organic molecule or an organic polymer. In region II, the molecule chain in the organic semiconducting layer 40 will align according to the alignment direction 1d of the microgrooves G of the photoresist layer 25 (as shown in FIG. 2a), thus forming an organic semiconducting portion 40b with alignment (as shown in FIG. 4a). As to regions I and III, since the underlying photoresist layer 25 in regions I and III does not have microgrooves G, the organic semiconducting layer 40 in these two regions is random.

Finally, a source S, drain D, dielectric layer 60, and gate 70 are sequentially formed to complete the top-gate OTFT as shown in FIG. 4a. According to the present invention, in order to make the channel between the source S and drain D have the best charge transport, the position of the source S and drain D can be designed to make the channel direction between the source S and drain D be the same as the alignment direction 1d of the microgrooves G (as shown in FIG. 2a).

Figure 4B:
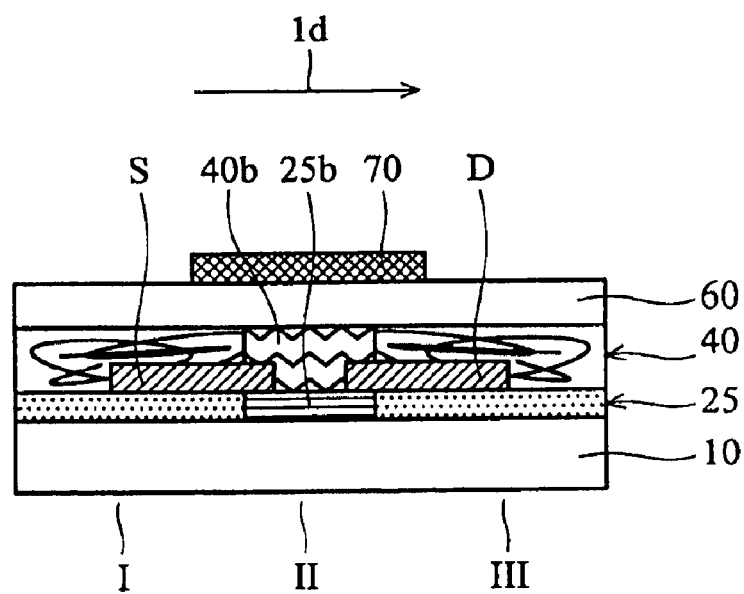

FIG. 4b is a cross-section of another top-gate type organic thin film transistor according to the present invention. The top-gate type organic thin film transistor includes a substrate 10; a photoresist layer 25 formed on the substrate 10, wherein the photoresist layer 25 is provided with a plurality of microgrooves G having an alignment direction; a source S and a drain D formed on the photoresist layer 25 and being in contact with the microgrooves G of the photoresist layer 25 respectively; an organic semiconducting layer 40 having alignment formed on the photoresist layer 25, the source S, and the drain D; a dielectric layer 60 formed on the organic semiconducting layer 40; and a gate 70 formed on the dielectric layer 60.

The structure of the OTFT of FIG. 4b is similar to FIG. 4a, and FIG. 4b differs from FIG. 4a only in that the source S and drain D are first formed and then the organic semiconducting layer 40 is formed. The process of forming the OTFT of FIG. 4b is similar to FIG. 4a; therefore, detailed descriptions are omitted. It should be noted that after the photoresist layer 20 is subjected to a photolithography treatment, a plurality of microgrooves G are formed in region II of the photoresist layer 25 labeled as 25b. These microgrooves G align according to the same direction 1d (as shown in FIG. 2a). In region II, the molecule chain in the organic semiconducting layer 40 will align to the alignment direction 1d of the microgrooves G of the photoresist layer 25 (as shown in FIG. 2a), thus forming an organic semiconducting portion 40b with alignment (as shown in FIG. 4b). As to regions I and III, since the underlying photoresist layer 25 does not have microgrooves G, the organic semiconducting layer 40 in these two regions is random. Moreover, according to the present invention, in order to make the channel between the source S and drain D have the best charge transport, the position of the source S and drain D can be designed to make the channel direction between the source S and drain D be the same as the alignment direction 1d of the microgrooves G (as shown in FIG. 2a).

Figure 5A:
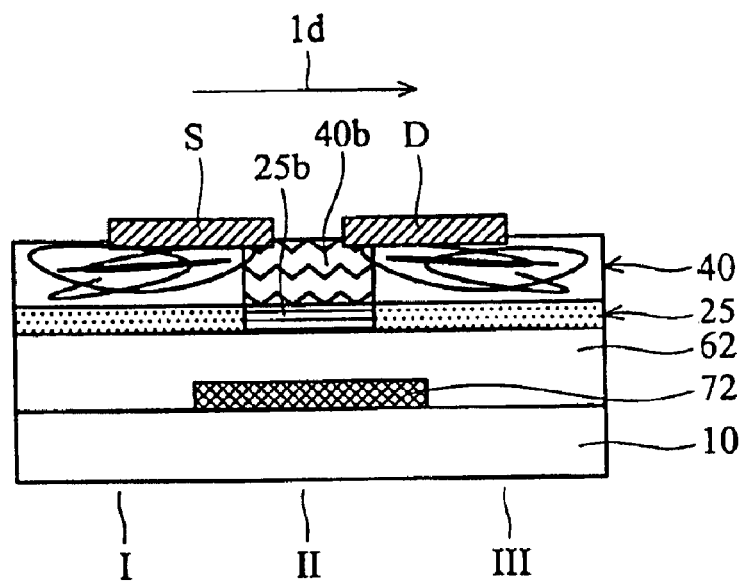
FIGS. 5a and 5b are cross-sections of the bottom-gate type OTFT of the present invention.

FIG. 5a is a cross-section of the bottom-gate type organic thin film transistor of the present invention. The bottom-gate OTFT includes a substrate 10; a gate 72 formed on the substrate 10; a dielectric layer 62 formed on the gate 72; a photoresist layer 25 formed on the dielectric layer 62, wherein the photoresist layer 25 is provided with a plurality of microgrooves G having an alignment direction; an organic semiconducting layer 40 having alignment formed on the photoresist layer 25; and a source S and a drain D formed on the organic semiconducting layer 40.

In FIG. 5a, the process of forming the photoresist layer 25 provided with a plurality of microgrooves and the process of forming the organic semiconducting layer 40 are the same as described above and are described in the following. Referring to FIG. 5a, a gate 72 and a dielectric layer 62 are sequentially formed on a substrate 10. Next, a photoresist layer 20 having a thickness of 0.5 μm to 5 μm is formed (as shown in FIG. 1a). Next, the photoresist layer 20 is subjected to a photolithography treatment to form a photoresist layer 25. Region II of the photoresist layer 25 forms a plurality of microgrooves G that align according to the same direction 1d (as shown in FIG. 2a). The photoresist portion in region II is labeled as 25b. The photoresist layer 25 in regions I and III remain unchanged.

Subsequently, an organic semiconducting layer 40 is formed on the photoresist layer 25 provided with microgrooves G. In region II, the molecule chain in the organic semiconducting layer 40 will align to the alignment direction 1d of the microgrooves G of the photoresist layer 25 (as shown in FIG. 2a), thus forming an organic semiconducting portion 40b with alignment (as shown in FIG. 5a). As to regions I and III, since the underlying photoresist layer 25 does not have microgrooves G, the organic semiconducting layer 40 in these two regions is random.

Finally, a source S and drain D are formed to complete the bottom-gate thin film transistor as shown in FIG. 5a. According to the present invention, in order to make the channel between the source S and drain D have the best charge transport, the position of the source S and drain D can be designed to make the channel direction between the source S and drain D be the same as the alignment direction 1d of the microgrooves G (as shown in FIG. 2a).

Figure 5B:
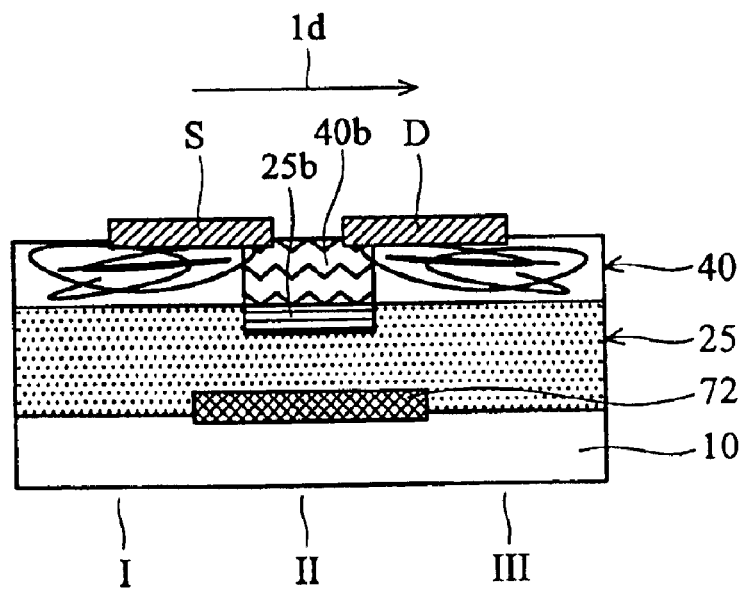

FIG. 5b shows a variation of the bottom-gate OTFT of FIG. 5a. FIG. 5b differs from FIG. 5a in that the OTFT of FIG. 5b does not have the dielectric layer 62 and the photoresist layer 25 with microgrooves G serves as an orientation film and a dielectric layer simultaneously.

Figure 6A:
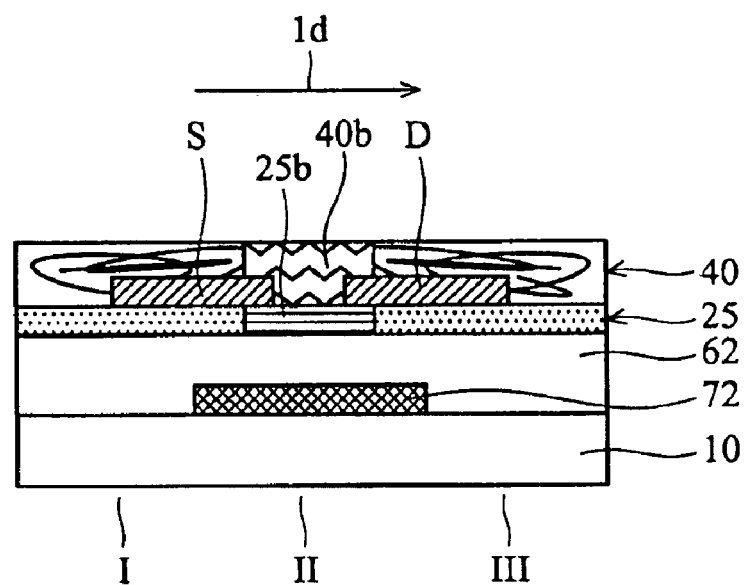
FIGS. 6a and 6b are cross-sections of another bottom-gate type OTFT of the present invention.

FIG. 6a is a cross-section of another bottom-gate type organic thin film transistor of the present invention. The bottom-gate OTFT includes a substrate 10; a gate 72 formed on the substrate 10; a dielectric layer 62 formed on the gate 72; a photoresist layer 25 formed on the dielectric layer 62, wherein the photoresist layer 25 is provided with a plurality of microgrooves G having an alignment direction; a source S and a drain D formed on the photoresist layer 25 and being in contact with the microgrooves G of the photoresist layer 25 respectively; and an organic semiconducting layer 40 having alignment formed on the photoresist layer 25, the source S, and the drain D.

The structure of the OTFT of FIG. 6a is similar to FIG. 5a and the difference resides in that in FIG. 6a, the source S and drain D are first formed and then the organic semiconducting layer 40 is formed. The process of forming the OTFT of FIG. 6a is similar to FIG. 5a and detailed descriptions are omitted. It should be noted that after the photoresist layer is subjected to the photolithography treatment, a plurality of microgrooves G are formed in region II of the photoresist layer 25 labeled as 25b. These microgrooves G align according to the direction 1d (as shown in FIG. 2a). In region II, the molecule chain in the organic semiconducting layer 40 will align to the alignment direction 1d of the microgrooves G of the photoresist layer 25 (as shown in FIG. 2a), thus forming an organic semiconducting portion 40b with alignment. As to regions I and III, since the underlying photoresist layer 25 does not have microgrooves G, the organic semiconducting layer 40 in these two regions is random. Moreover, according to the present invention, in S order to make the channel between the source S and drain D have the best charge transport, the position of the source S and drain D can be designed to make the channel direction between the source S and drain D be the same as the alignment direction 1d of the microgrooves G (as shown in FIG. 2a).

Figure 6B:
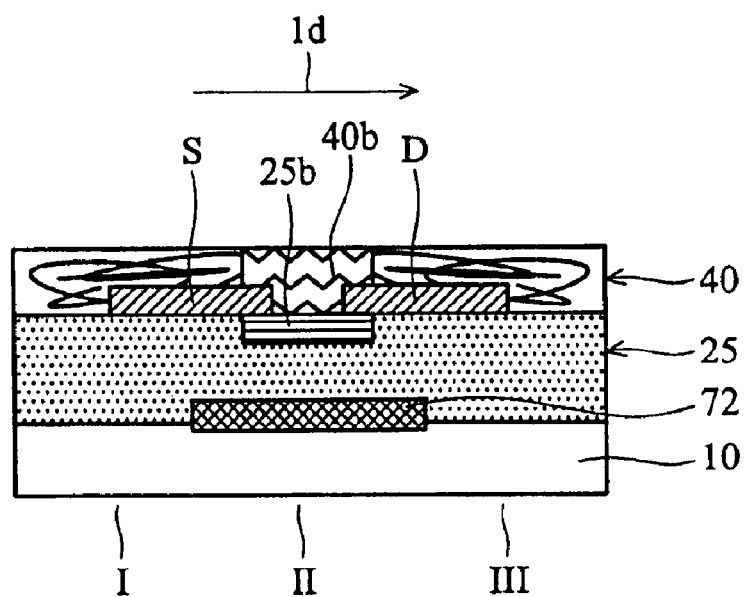

FIG. 6b shows a variation of the bottom-gate OTFT of FIG. 6a. FIG. 6b differs from FIG. 6a in that the OTFT of FIG. 6b does not have the dielectric layer 62 and the photoresist layer 25 with microgrooves G serves as an orientation film and a dielectric layer simultaneously.

In conclusion, the present invention uses a photolithography process through a mask to form microgrooves in a photoresist layer. Thus, the organic semiconducting layer can align according to the alignment direction of the microgrooves. Thus, the molecule alignment of an organic semiconducting layer can be accurately defined. It is possible to control the organic molecule to have better molecule alignment in the channel region to increase conductivity, and to have different molecule alignment or no molecule alignment in the non-channel region to decrease conductivity. In this way, device properties and circuit design can be improved and current leakage and crosstalk between pixels can be reduced.

The foregoing description of the preferred embodiments of this invention has been presented for purposes of illustration and description. Obvious modifications or variations are possible in light of the above teaching. The embodiments chosen and described provide an excellent illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A process for forming an organic semiconducting layer having molecular alignment, comprising the following steps:

forming a photoresist layer on a substrate or a dielectric layer;

subjecting the photoresist layer to a photolithography process through a mask to form a plurality of microgrooves with an alignment direction; and forming an organic semiconducting layer on the photoresist layer having microgrooves, such that the organic semiconducting layer aligns according to the alignment direction of the microgrooves of the photoresist layer.

2. The process as claimed in claim 1, wherein the photolithography process forms a plurality of microgrooves in different regions of the substrate, wherein the microgrooves in the same region have the same alignment direction and the microgrooves in different regions have the same or different alignment directions.

3. The process as claimed in claim 2, further comprising the following steps:

forming first microgrooves aligned according to a first direction in a first region of the substrate, and concurrently forming second microgrooves aligned according to a second direction in a second region of the substrate, wherein the first and second directions are different; and forming a source and a drain, wherein the source and drain are in contact with the organic semiconducting layer having alignment, such that a channel is formed between the source and drain, the organic semiconducting layer in the channel region aligns according to the first direction and the organic semiconducting layer in the non-channel region aligns according to the second direction.

4. The process as claimed in claim 1, wherein the substrate is a silicon wafer, glass, quartz, a plastic substrate, or a flexible substrate.

5. The process as claimed in claim 1, wherein the organic semiconducting layer is formed by deposition.

6. The process as claimed in claim 5, wherein the organic semiconducting layer is formed by vacuum evaporation, vapor deposition, solution deposition, or directional deposition.

7. The process as claimed in claim 1, wherein the step of forming the photoresist layer forms the photoresist layer having a thickness of 0.5 $\mu$m to 5 $\mu$m.

8. The process as claimed in claim 7, wherein the microgrooves have a depth of 0.3 $\mu$m to 1 $\mu$m.

9. The process as claimed in claim 7, wherein the microgrooves have a width pitch of 0.5 $\mu$m to 2 $\mu$m.

10. A process for forming an organic device, comprising the following steps:

forming a photoresist layer on a substrate or a dielectric layer;

subjecting the photoresist layer to a photolithography process through a mask to form a plurality of microgrooves having an alignment direction;

forming an organic semiconducting layer on the photoresist layer having microgrooves, such that the organic semiconducting layer aligns according to the alignment direction of the microgrooves of the photoresist layer; and forming an electrode.

11. The process as claimed in claim 10, wherein the photolithography process forms a plurality of microgrooves in different regions of the substrate, wherein the microgrooves in the same region have the same alignment direction and the microgrooves in different regions have the same or different alignment directions.

12. The process as claimed in claim 11, wherein the photolithography process includes forming first microgrooves aligned according to a first direction in a first region of the substrate, and concurrently forming second microgrooves aligned according to a second direction in a second region of the substrate, wherein the first and second directions are different; and the step of forming the electrode includes forming a source and a drain, wherein the source and drain are in contact with the organic semiconducting layer having alignment, such that a channel is formed between the source and drain, the organic semiconducting layer in the channel region aligns according to the first direction and the organic semiconducting layer in the non-channel region aligns according to the second direction.

13. The process as claimed in claim 10, wherein the substrate is a silicon wafer, glass, quartz, a plastic substrate, or a flexible substrate.

14. The process as claimed in claim 10, wherein the organic semiconducting layer is formed by deposition.

15. The process as claimed in claim 14, wherein the organic semiconducting layer is formed by vacuum evaporation, vapor deposition, solution deposition, or directional deposition.

16. The process as claimed in claim 10, wherein the step of forming the photoresist layer forms the photoresist layer having a thickness of 0.5 $\mu$m to 5 $\mu$m.

17. The process as claimed in claim 16, wherein the microgrooves have a depth of 0.3 $\mu$m to 1 $\mu$m.

18. The process as claimed in claim 16, wherein the microgrooves have a width pitch of 0.5 $\mu$m to 2 $\mu$m.

19. The process as claimed in claim 10, wherein the dielectric layer has a dielectric constant higher than 3.

20. The process as claimed in claim 19, wherein the dielectric layer is inorganic material or polymer material.

21. The process as claimed in claim 10, wherein the organic device is a top-gate type organic thin film transistor (OTFT).

22. The process as claimed in claim 10, wherein the organic device is a bottom-gate type organic thin film transistor (OTFT).

* * * * *